US011749353B2

(12) United States Patent
Kavalipurapu et al.

(10) Patent No.: US 11,749,353 B2
(45) Date of Patent: *Sep. 5, 2023

(54) MANAGING SUB-BLOCK ERASE OPERATIONS IN A MEMORY SUB-SYSTEM

(71) Applicant: Micron Technology, Inc., Boise, ID (US)

(72) Inventors: Kalyan Chakravarthy Kavalipurapu, Telangana (IN); Tomoko Ogura Iwasaki, San Jose, CA (US); Erwin E. Yu, San Jose, CA (US); Hong-Yan Chen, San Jose, CA (US); Yunfei Xu, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/745,852

(22) Filed: May 16, 2022

(65) Prior Publication Data
US 2022/0277795 A1 Sep. 1, 2022

Related U.S. Application Data

(63) Continuation of application No. 16/991,836, filed on Aug. 12, 2020, now Pat. No. 11,335,412.
(Continued)

(51) Int. Cl.
*G11C 16/16* (2006.01)
*G06F 3/06* (2006.01)
(Continued)

(52) U.S. Cl.
CPC ............ *G11C 16/16* (2013.01); *G06F 3/0604* (2013.01); *G06F 3/064* (2013.01); *G06F 3/0652* (2013.01);
(Continued)

(58) Field of Classification Search
CPC ..... G11C 16/16; G11C 16/0483; G11C 16/08; G11C 16/3427; G11C 5/147; G11C 7/18;
(Continued)

(56) References Cited

U.S. PATENT DOCUMENTS 1,083,992 A 1/1914 Couch
9,563,504 B2 2/2017 Liang et al.
(Continued)

*Primary Examiner* — Hoai V Ho
(74) *Attorney, Agent, or Firm* — Lowenstein Sandler LLP

(57) ABSTRACT

A processing device in a memory system receives an erase request to erase data stored at a data block of a memory device, the erase request identifying a selected sub-block of a plurality of sub-blocks of the data block for erase, each of the plurality of sub-blocks comprising select gate devices (SGDs) and data storage devices. For each sub-block of the plurality of sub-blocks not selected for erase, the processing device applies an input voltage at a bitline of the respective sub-block and applies a plurality of gate voltages to a plurality of wordlines of the respective sub-block, the plurality of wordlines are coupled to the SGDs and to the data storage devices, each voltage of the plurality of voltages applied to a successive wordline of the plurality of wordlines is less than a previous voltage applied to a previous wordline.

20 Claims, 7 Drawing Sheets

Related U.S. Application Data

(60) Provisional application No. 62/956,049, filed on Dec. 31, 2019.

(51) Int. Cl.
  *G11C 16/04* (2006.01)
  *G11C 16/08* (2006.01)

(52) U.S. Cl.
  CPC ........ *G06F 3/0679* (2013.01); *G11C 16/0483* (2013.01); *G11C 16/08* (2013.01)

(58) Field of Classification Search
  CPC ... G11C 8/14; G11C 16/3404; G11C 16/3431; G06F 3/0604; G06F 3/064; G06F 3/0652; G06F 3/0679; G06F 3/0608; G06F 13/1694
  USPC ........................................................ 711/103
  See application file for complete search history.

(56) References Cited

U.S. PATENT DOCUMENTS

| | | | |
|---|---|---|---|
| 11,335,412 B2 * | 5/2022 | Kavalipurapu | ....... G06F 3/0679 |
| 2020/0388335 A1 | 12/2020 | Chibvongodze et al. | |
| 2021/0272638 A1 | 9/2021 | Hou et al. | |

* cited by examiner

MANAGING SUB-BLOCK ERASE OPERATIONS IN A MEMORY SUB-SYSTEM

CROSS-REFERENCE TO RELATED APPLICATIONS

This application is a continuation application of co-pending U.S. application Ser. No. 16/991,836, filed Aug. 12, 2020, which claims the benefit of priority from U.S. Provisional Application No. 62/956,049, filed on Dec. 31, 2019, each of which is incorporated herein by reference.

TECHNICAL FIELD

Embodiments of the disclosure relate generally to memory sub-systems, and more specifically, relate to managing sub-block erase operations in a memory sub-system.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
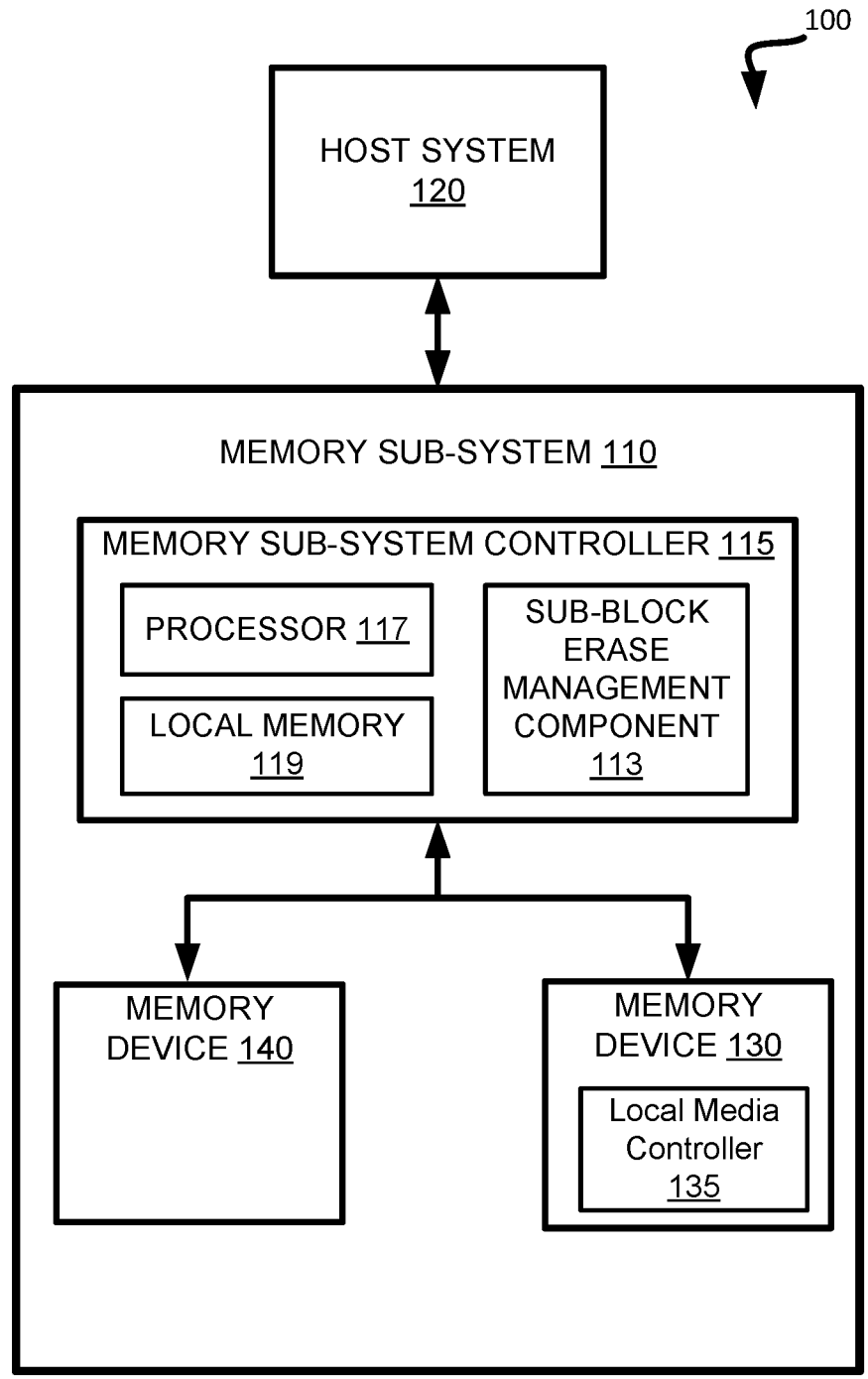
FIG. 1 illustrates an example computing system that includes a memory sub-system in accordance with some embodiments of the present disclosure.

Aspects of the present disclosure are directed to managing sub-block erase operations in a memory sub-system. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory device can be a non-volatile memory device. A non-volatile memory device is a package of one or more dies. Each die can consist of one or more planes. For some types of non-volatile memory devices (e.g., NAND devices), each plane consists of a set of physical blocks. Each block consists of a set of pages. Each page consists of a set of memory cells ("cells"). A cell is an electronic circuit that stores information. A data block hereinafter refers to a unit of the memory device used to store data and can include a group of memory cells, a word line group, a word line, or individual memory cells. Memory pages (also referred to herein as "pages") store one or more bits of binary data corresponding to data received from the host system. The memory cells of a data block can be arranged along a number of separate wordlines. To achieve high density, a string of memory cells in a non-volatile memory device can be constructed to include a number of memory cells at least partially surrounding a pillar of channel material. The memory cells can be coupled to access lines, which are commonly referred to as "wordlines," often fabricated in common with the memory cells, so as to form an array of strings in a block of memory. The compact nature of certain non-volatile memory devices, such as 3D flash NAND memory, means wordlines are common to many memory cells within a block of memory.

Each data block can include a number of sub-blocks, where each sub-block is defined by an associated pillar (e.g., a vertical conductive trace) extending from a shared bitline. Each pillar can include a number of data storage devices coupled to dummy wordlines (i.e. wordlines that are generally not used for storing host data) and data wordlines (i.e. wordlines that are generally used for storing host data).

Sub-blocks of a data block can be accessed separately in certain operations (e.g., to perform program or read operations), while other operations (e.g., block erase operation) apply to the whole data block. Since the data block in certain memory devices (e.g., three-dimensional NAND) can include a structure to selectively enable the pillar associated with a certain sub-block, while disabling the pillars associated with other sub-blocks, enabling sub-block erase can be desirable in order to improve the performance and granularity of the block erase operations of the memory sub-system. In one embodiment, this structure for enabling certain pillars while disabling others includes one or more select gate devices positioned at either or both ends of each pillar. Depending on a control signal applied, these select gate devices can either enable or disable the conduction of signals through the pillars. In one embodiment, the select gates devices associated with each pillar in the data block are controlled separately.

Conventional memory devices perform erase operation on the whole data block with no support for smaller granularity for the size of a memory region on which an erase operation is performed. This fixed-size erase block introduces latencies for the memory sub-system because erase operations are performed at high frequency. Additionally, for multi-dimensional memory devices (e.g., 3D NAND), improved latency is particularly important in order to take advantage of the advanced architecture of the new memory device. In order to enable improved performance for the multi-dimensional memory devices, a solution of performing erase operations on only certain portions of the data block, thus expediting the erase operations by reducing the number of data verification operations, may be desired.

Aspects of the present disclosure address the above and other deficiencies by enabling the execution of the erase operation on selected sub-blocks of the data block, while inhibiting the execution of the erase operation on the unselected sub-blocks of the data block. In an implementation, all sub-blocks of the data block receive the same erase signal in the form of an input voltage from the bitline. In order to inhibit erasing certain sub-blocks, a channel voltage that is applied at the data wordlines of the excluded sub-block should be as close to zero volts as possible. Reducing the voltage from an input voltage value (e.g., 24 volts) to zero volts can be done gradually in order to minimize disturbances to the memory cells of the excluded sub-block. This can be achieved by gradually reducing the input voltage using a group of wordlines coupled to a number of select gate devices (SGDs) and a group of wordlines (e.g., dummy wordlines and possibly data wordlines) coupled to a number of data storage devices, such that the gate voltage at each device can be less than the gate voltage at the previous device by a predetermined step down interval. The number of SGDs and the group of wordlines are specific to each sub-block of the data block. By reducing the gate voltage by a step down interval at each device, when the gate voltage arrives at the first data wordline to be used for storing host data, the value of the pillar voltage received at the first data wordline is reduced to approximately 0 volts, thus suppressing the erase operation in the excluded sub-block while minimizing disturbances (e.g., caused by hot electron injection) to the memory cells of the excluded sub-block.

In certain implementations, two adjacent data blocks can be linked by connecting adjacent wordlines of the two data blocks using local wordline (WL) connection shorts, such that a WL of one data block is connected to a corresponding WL of the other data block using the connection short. When two WLs are connected, a single string driver can be used for driving the two WLs, thus enabling a single read or program operation to be applied to the two connected WLs. However, to enable erase operation on a sub-block granularity, it can be desirable to have separate string drivers for certain data wordlines. As an example, adding the top-most data wordlines to the group of wordlines where voltage step down is applied can ensure that the gate voltage is reduced to at least 0 volts by the time it arrives at the data wordlines that needs to be erase suppressed (e.g., data wordlines used for storing host data). In this case, the data wordlines of a data block that will be used for voltage step down can have separate string drivers that are not shared by corresponding data wordlines in the other data block. This can be done by disabling the local connection short for those data wordlines that connects the two data blocks, as explained in more details below.

In certain implementations, the memory sub-system can reduce the overall power consumption of the memory device by reducing the number of voltage supplies required for supplying voltage to the memory device. For example, the memory sub-system can enable sharing of a voltage supply between two adjacent devices of the data block by adjusting a threshold voltage of each device, such that applying the same voltage at the gate of the adjacent devices can result in the same stepping down voltage at each device. In implementations, sharing of the voltage supply between adjacent devices can be applicable to certain devices including select gate devices and data storage devices connected to dummy wordlines.

In certain implementations, the memory sub-system can further reduce the disturbances caused during the voltage step down process (e.g., hot electron disturbance) by increasing the thickness of the oxide layer between certain wordlines of the data block. For example, the thickness of the oxide layer between the dummy wordlines can be increased by a pre-determined amount, thus providing a longer channel for stepping down the gate voltage before reaching the data wordlines of the data block. In implementations, the predetermined amount of thickness increase in the oxide can be calculated in order to minimize read performance penalties of the data block.

The techniques of managing sub-block erase operations of a data block in a memory sub-system that are described herein enable an improved overall performance of the memory sub-system. Enabling selective sub-blocks for erase operations while inhibiting the erase operation on other sub-blocks increases the granularity of the unit of data where the erase operation is to be performed, resulting in more efficient erase operations of data blocks in the memory sub-system. For example, the read and write operations that are received at the data block no longer need to wait for a time-consuming erase operation to be completed before they can be executed. Further, because certain sub-blocks can be excluded from the erase operation, the latency of performing erase operations on data blocks of the memory device can be reduce significantly. Given that erase operations are executed on the memory device at a high frequency, reducing the latency or the erase operation while increasing the granularity of the erase operation improves the overall performance of the memory device.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access the memory components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as three-dimensional cross-point ("3D cross-point") memory. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., a processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

In one embodiment, the memory sub-system 110 includes sub-block erase management component 113 that can be used to perform an erase operation on one or more sub-blocks of a data block of memory device 130 or memory device 140, while preventing other sub-blocks of the data block from being erased by the erase operation. In implementations, in order to inhibit erasing the unselected sub-blocks of the data block, a gate voltage that is applied at the data wordlines of the unselected sub-blocks can be reduced to approximately zero volts, thus suppressing the erase signal applied at the unselected sub-blocks and preventing the data stored at the data wordlines from being erased. Sub-block erase management component 113 can reduce the gate voltage from an input voltage value (e.g., 24 volts) to zero volts gradually in order to minimize disturbances to the memory cells of the unselected sub-block. Sub-block erase management component 113 can reduce the gate voltage using a group of wordlines coupled to a number of select gate devices (SGDs) and a group of wordlines (e.g., dummy wordlines) coupled to a number of data storage devices, such that the gate voltage at each wordline can be less than the gate voltage at the previous wordline by a predetermined step down interval (e.g., a step down interval of 3.5V).

In one implementation, sub-block erase management component 113 can further enable the top most one or more data wordlines (i.e., the one or more data wordlines closest to the shared bitline) of the unselected sub-block to be driven by a separate string driver than corresponding top most data wordlines of an adjacent sub-block of the data block. As an illustrative example, two adjacent data blocks can be linked by connecting adjacent data wordlines of the two data blocks using local wordline (WL) connection shorts, such that a data wordline of one data block is connected to a corresponding data wordline of the other data block using the connection short. When the two data wordlines are connected, a single string driver can be used for driving the two data wordlines, thus enabling a single read or program operation to be applied to the two connected wordlines.

However, to enable erase operation on a single sub-block, one or more data wordlines of the unselected sub-blocks can require separate string drivers than the data wordlines of the selected sub-block (e.g., because one or more data wordlines of the unselected sub-block can be used in voltage step down process). In this case, sub-block erase management component 113 can disable the local connection short for the data wordlines that will be used in the voltage step down process, as explained in more details in FIG. 2. Consequently, different gate voltage can be applied to the data wordlines that are used for voltage step down than the gate voltage applied to data wordlines that included in the erase operation.

In certain implementations, sub-block erase management component 113 can improve the power consumption of memory device 130 by reducing the number of voltage supplies required for supplying voltage to memory device 130. In this case, sub-block erase management component 113 can enable sharing of a voltage supply between two adjacent devices of the data block by adjusting a threshold voltage of each device, such that applying the same voltage at the gate of the adjacent devices can result in the same stepping down voltage at each device. In implementations, sharing of the voltage supply between adjacent devices can be applicable to certain devices including select gate devices and data storage devices connected to dummy wordlines.

In certain implementations, sub-block erase management component 113 can further reduce disturbance to the memory cells of the data block that can be caused by hot electron injection that can be generated as a result of the voltage step down process. For example, when the gate voltage is abruptly reduced at a given wordline, the wordline can suffer from hot-electron ("hot-e") disturb where a large voltage differential between the gate and source causes the residue electrons to be injected from a drain depletion region into the floating gate. In this case, sub-block erase management component 113 can enable increasing the thickness of the oxide layer between certain wordlines of the data block to increase an internal channel length to provide better signal isolation. For example, the thickness of the oxide layer between the dummy wordlines can be increased by a predetermined amount, thus providing a longer channel for stepping down the gate voltage before reaching the data wordlines of the data block. In implementations, the predetermined amount of thickness increase in the oxide can be calculated in order to minimize read performance penalties of the data block.

Figure 2:
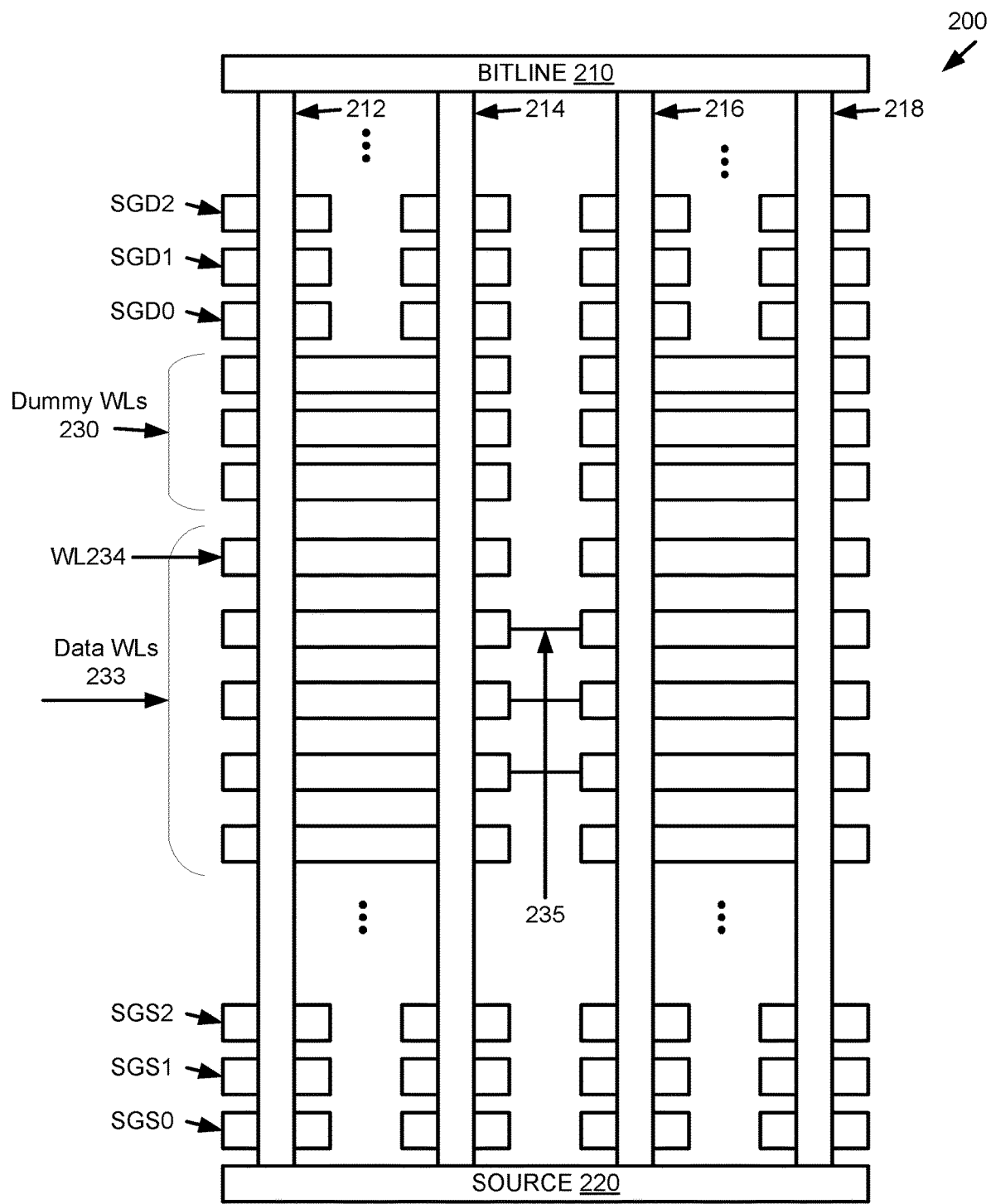
FIG. 2 is a block diagram illustrating select gate devices and data storage device in a data block of a memory device in a memory sub-system in accordance with some embodiments of the present disclosure.

FIG. 2 is a block diagram illustrating select gate devices and data storage devices in a data block of a memory device in a memory sub-system in accordance with some embodiments of the present disclosure. In one embodiment, data block 200 is representative of any of the data blocks that make up memory device 130 or memory device 140. Data block 200 can be one of a number of physical blocks in the memory device and can include a set of memory pages. The memory pages store one or more bits of binary data corresponding to data received from the host system. The memory cells of data block 200 can be arranged along a number of separate wordlines 230 and 233. Data block 200 can include a shared bitline 210 having a number of pillars 212, 214, 216, 218 extending therefrom to a separate source line 220. Each pillar can be a vertical conductive trace and the intersections of each of pillars 212, 214, 216, 218 and of each of wordlines 230 and 233 form the memory cells. Thus, each of pillars 212, 214, 216, 218 forms a separate sub-block within data block 200, where each sub-block can be access separately. To enable an access operation, such as a program operation or a read operation, to be performed on a given sub-block, data block 200 includes a number of select gate devices to selectively enable the pillar (e.g., pillar 212) associated with a certain sub-block, while disabling the pillars (e.g., pillars 214, 216, 218) associated with other sub-blocks. For example, each pillar can include a number of select gate devices (e.g., SGD0, SGD1, SGD2) at a first end (e.g., a drain end) and a number of select gate devices (e.g., SGS0, SGS1, SGS2) at a second end (e.g., a source end). In other examples, a different number of select gate devices can be used at each end of the sub-block.

In one embodiment, the select gate devices in data block 200 are formed using programmable replacement gate transistors. Thus, the select gate devices have a programmed threshold voltage. Depending on a magnitude of a control signal applied relative to the threshold voltage, the select gate devices can either enable or disable the conduction of signals through the corresponding pillar. For example, if the magnitude of the control signal applied to a select gate device is less than the threshold voltage, the select gate device can be turned off and can prevent signal flow through the corresponding pillar. Conversely, if the magnitude of the control signal is greater than the threshold voltage, the select gate device can be turned on and can permit signal flow through the corresponding pillar. In one embodiment, the select gates devices associated with each pillar in data block 200 are controlled separately, such that signal flow can be prevented in certain pillars while permitted in other pillars at the same time. Replacement gate transistors have a relatively short internal channel length, and thus are susceptible to some amount of signal leakage. Accordingly, in one embodiment, each pillar in data block 200 has multiple select gate devices at each of the drain end and the source end, effectively increasing the internal channel length to provide better signal isolation when turned off.

Following the select gate devices on the vertical conductive trace are data storage devices that are coupled to dummy wordlines 230 then another group of data storage devices that are coupled to data wordlines 233. In certain implementations, in order to support improved latency for multi-dimensional memory devices (e.g., 3D NAND), memory sub-system 110 can enable connecting two adjacent data blocks to form data block 200. As an example, memory sub-system 110 can connect sub-block 214 of one data block to sub-block 216 of an adjacent data block using local wordline (WL) connection shorts 235 between data wordlines 233, such that a data WL of sub-block 214 is connected to a corresponding data WL of sub-block 216 using the connection short. These connection shorts, however, result in the same voltage being applied to the data wordlines that are connected together. Given that excluding certain sub-blocks from an erase operation can require different voltage to be applied to the top most data wordlines of the excluded sub-block than the voltage applied at the top-most data wordlines for the sub-block included in the erase, the connection short can be eliminated for certain data wordlines. For example, the top most data wordline 234 can have a separate string driver in order to enable a different voltage to be applied to data wordline 234, without affecting a corresponding data wordline in an adjacent sub-block. Therefore, as shown in FIG. 2, data wordline 234 of sub-block 212 can be disconnected from the corresponding data wordline of sub-block 214. Accordingly, because there is no connection short for the top-most data wordline 234 of data block 200, data wordline 234 can be used in the process of stepping the gate voltage to exclude sub-block 212 from an erase operation, while the corresponding data wordline of sub-block 214 can have a different voltage applied to it to include sub-block 214 in the erase operation.

Figure 3:
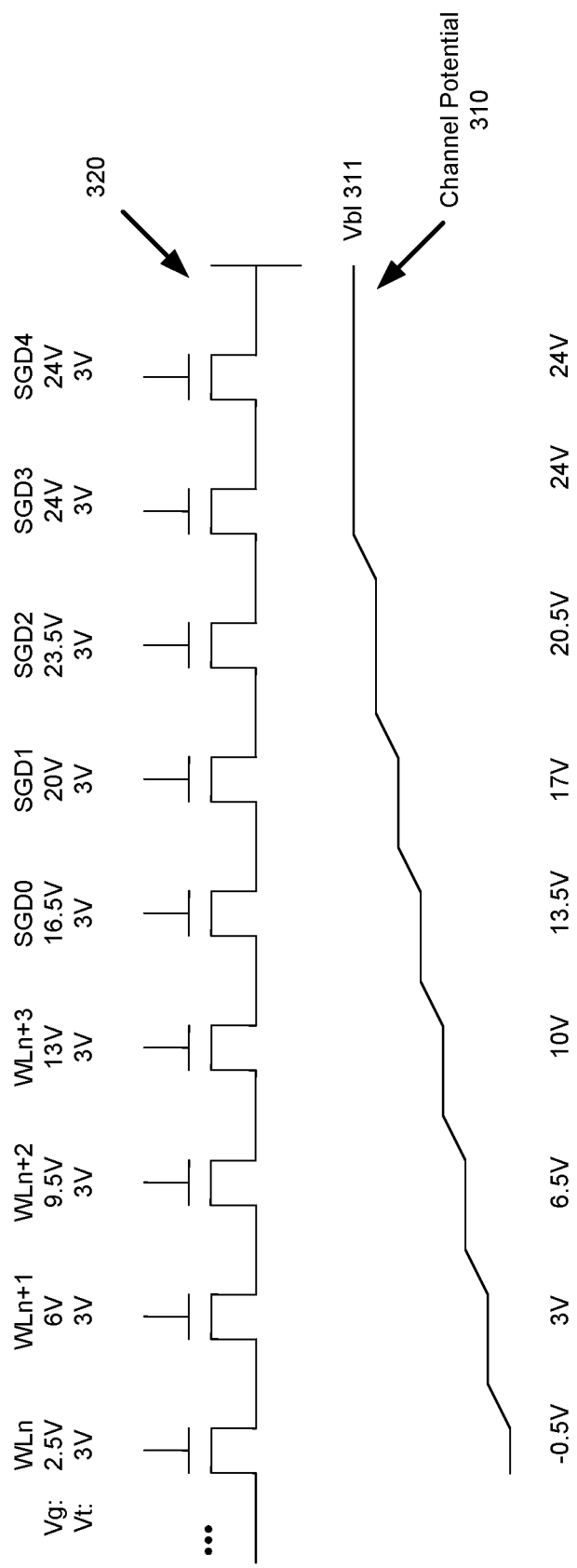
FIG. 3 is a diagram illustrating the gate voltage step down process using a string of devices during an erase operation, in accordance with some embodiments of the present disclosure.

FIG. 3 is a diagram illustrating the gate voltage step down process using a string of devices during an erase operation, in accordance with some embodiments of the present disclosure. In one embodiment, string 320 can be the same or similar to pillar 212 illustrated in FIG. 2. As described above, string 320 includes a number of drain select gate (SGD) devices SGD0-SGD4, a number of data storage devices, each connected to a separate wordline (WL) WLn-WLn+3. In one embodiment, one or more of the data storage devices are connected to a dummy word line WLn+1 to WLn+3 and are generally not used for storing data. String 320 can further include a number of data storage devices connected to data WLs. At least one data WL WLn can be used in the voltage step sown process. Depending on the embodiment, there can be any number of data word lines. In one embodiment, string 320 represents a sub-block of a data block that is excluded from the erase operation. As described above, the data block can include additional sub-blocks having additional strings of devices.

As described above with respect to FIG. 1, in one embodiment, sub-block erase management component 113 can apply different voltage signals to the gate terminal of the different devices of string 320 to gradually decrease an input voltage during an erase operation, such that the data wordlines of string 320 are excluded from the erase operation. This voltage can be referred to as the gate voltage (Vg). Additionally, each of the devices in string 320 has an associated threshold voltage (Vt) which represents a voltage at which each device switches from an "off" state to an "on" state, or vice versa. As an example, each of the SGD devices SGD0-SGD4 and the data storage devices WLn-WLn+3 can have a threshold voltage of 3V. In one implementation, the channel potential 310 of string 320 represents a difference between a voltage applied at the control gate of each device (i.e., a gate voltage (Vg)) and a threshold voltage of the device (Vt).

In certain implementations, sub-block erase management component 113 can determine a step down interval to use for gradually reducing the gate voltage at each successive device, such that the gate voltage that is applied to the first data wordline that will be used for storing host data can reach a threshold level. In an implementation, the threshold level can be an amount of voltage that is small enough such that the data stored at the data wordlines are preserved and not erased. For example, the threshold level can be approximately zero volts. In certain implementations, memory sub-system 110 can use a step down interval of approximately 3.5 volts when reducing the gate voltage that is applied at each wordline that is connected to each SGD, each dummy wordline, and each data wordline that is used in the stepping down process of the gate voltage, such that the voltage applied at each wordline is less than the voltage applied at the previous wordline by approximately 3.5 volts. For example, if the gate voltage step down process start at SGD2 with a Vg at SGD2=23.5V, then Vg at SGD1 can be 20V (i.e., a gate voltage of 23.5V at the previous SGD2 minus the step down interval of 3.5V). By reducing Vg at each device SGD0-SGD4 and WLn-WLn+3 by the 3.5V step down interval, the result can be a Vg of 13V at WLn+3, a Vg of 9.5V at WLn+2, a Vg of 6V at WLn+1, and a Vg of 2.5V at WLn.

Gradually stepping down the gate voltage is desirable to avoid a sharp change in channel potential between WLn+3 and WLn. Such a sharp change in channel potential can create a large electric field, leading to increased hot electron injection, which would magnify erase disturb problems for the data wordlines of string 320. As illustrated in FIG. 3, by gradually decreasing the gate voltage at each device, channel potential 310 is also decreased gradually, thus minimizing disturbances to the data wordlines. As a result, channel potential 320 on the drain-side of SGD2 is 20.5V (i.e., a gate voltage of 23.5V minus a threshold voltage of 3V). Similarly, channel potential 320 at SGD1 is 17V (20V–3V), channel potential 320 at SGD0 is 13.5V. Channel potential 320 continues to decrease gradually at dummy wordlines WLn+3-WLn+1 and data wordline WLn, such that channel potential 320 at WLn+3 is 10V, channel potential 320 at WLn+2 is 6.5V, and channel potential 320 at WLn+1 is 3V. The channel potential 320 is around −0.5V when it arrives at the first data wordline WLn. Because channel potential 320 is close to zero at the data wordlines used for storing data, the erase signal will not affect the data stored at the data wordlines of string 320, thus the data will be excluded from erase.

Figure 4:
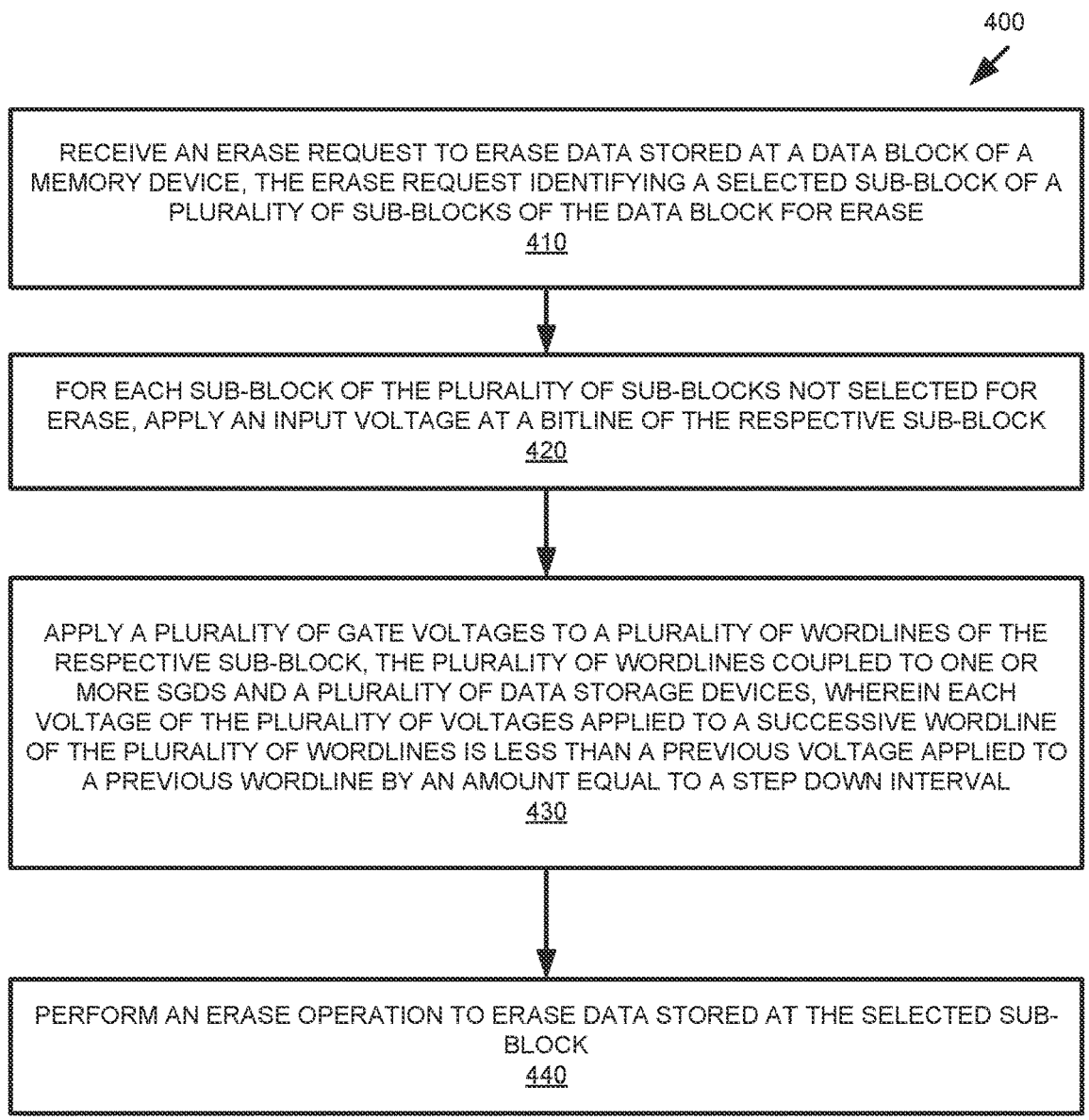
FIG. 4 is a flow diagram of an example method of implementing a sub-block erase operations in a memory sub-system, in accordance with some embodiments of the present disclosure.

FIG. 4 is a flow diagram of an example method of implementing a sub-block erase operations in a memory sub-system, in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by sub-block erase management component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 410, the processing logic receives an erase request to erase data stored at a data block of memory device 130. In implementations, the erase request identifies a selected sub-block of a set of sub-blocks of the data block for erase. In one implementations, each sub-block of the data block can include a number of select gate devices (SGDs) and a number of data storage devices, as explained in more details herein above.

At operation 420, the processing device loops through the set of sub-blocks not selected for erase to gradually suppress an input voltage signal, such that the data stored at data wordlines of the unselected sub-blocks is not erased. As explained above, the processing logic applies an input voltage (e.g., 24V) at a bitline of each sub-block of the data block.

At operation 430, for each unselected sub-block, the processing logic applies different gate voltages to the wordlines coupled to the SDG devices of the sub-block and to a group of wordlines associated with data storage devices, such that each voltage applied to a successive wordline is less than a previous voltage applied to a previous wordline by an amount equal to a step down interval (e.g., 3.5V interval). In implementations, the voltage stepping down process further include that each wordline has a threshold voltage that is lower than the gate voltage at the device (e.g., a threshold voltage of 3V), as explained in more details here. In this case, when the voltage stepping down process is complete, the gate voltage is reduced to at least 0 volts at the first usable data wordline of the sub-block (e.g., data wordlines used for storing host data).

At operation 440, the processing logic performs an erase operation to erase data stored at the selected sub-block, while inhibiting the erase for data stored at the unselected sub-blocks, as explained in more details herein above.

Figure 5:
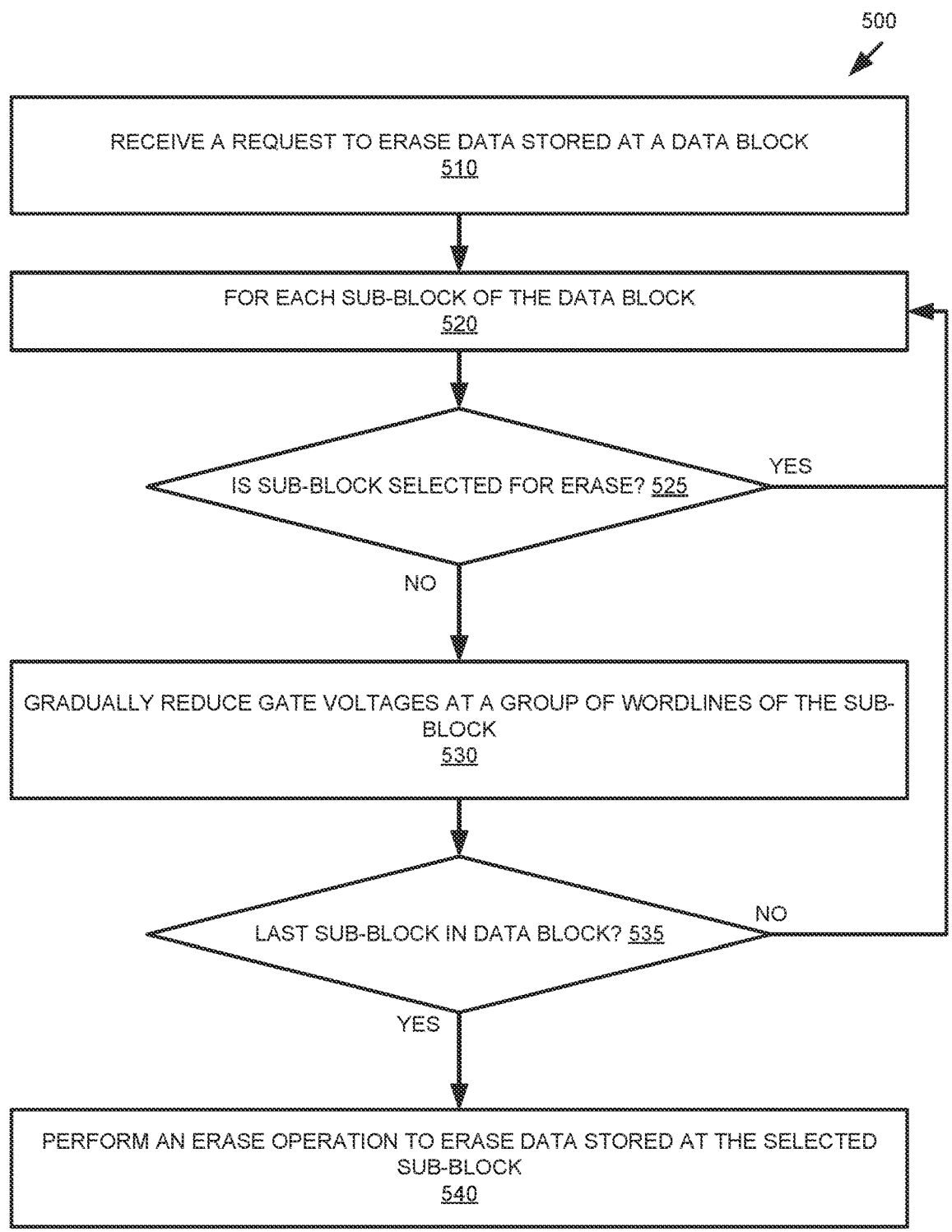
FIG. 5 is a flow diagram of an example method of inhibiting the execution of an erase operation on unselected sub-blocks of a data block in a memory sub-system, in accordance with some embodiments of the present disclosure.

FIG. 5 is a flow diagram of an example method of inhibiting the execution of an erase operation on unselected sub-blocks of a data block in a memory sub-system, in accordance with some embodiments of the present disclosure. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by sub-block erase management component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 510, the processing logic receives a request to erase data stored at a data block of memory device 130. In certain implementations, the data block include a set of sub-blocks and the request identifies one or more selected sub-blocks of the set of sub-blocks of the data block to be erased. The other sub-blocks not identified in the erase request are excluded from erasing. In one implementations, each sub-block of the data block can include a number of select gate devices (SGDs) and a number of data storage devices, as explained in more details herein above.

At operation 520, the processing device loops through the set of sub-blocks of the data block to identify whether or not the sub-block can be erased. At operation 525, if the processing logic determines that a sub-block is selected for erasing, the processing logic can continue the loop to the next sub-block because the selected sub-block can be ready for the erase operation to be performed.

On the other hand, if the processing logic determines that the sub-block is unselected for erase, the processing logic at operation 530 can start a voltage step down process using a group of wordlines coupled to SGD devices, a group of dummy wordlines, and one or more data wordlines, as explained in more details herein above. As explained above, after the voltage step down process is completed, a gate voltage applied at data wordlines storing host data can be approximately zero volts, thus prohibiting the data stored at the wordlines form being erased, as explained in more details herein above.

At operation 535, if the processing logic completes looping through the sub-blocks of the data block, the processing logic, at operation 540, can perform an erase operation to erase data stored at selected sub-blocks of the data blocks. In this case, because the gate voltage has been reduced to zero volts at the data wordlines of the unselected sub-blocks, whereas the gate voltage at the data wordlines of the selected sub-blocks remains high (e.g., 24V), the erase operation will only erase data stored at the selected sub-blocks. On the other hand, if the processing logic at operation 535 determines that more sub-blocks need to be checked, the processing logic can loop back to operation 520 to evaluate the next sub-block of the data block.

Figure 6:
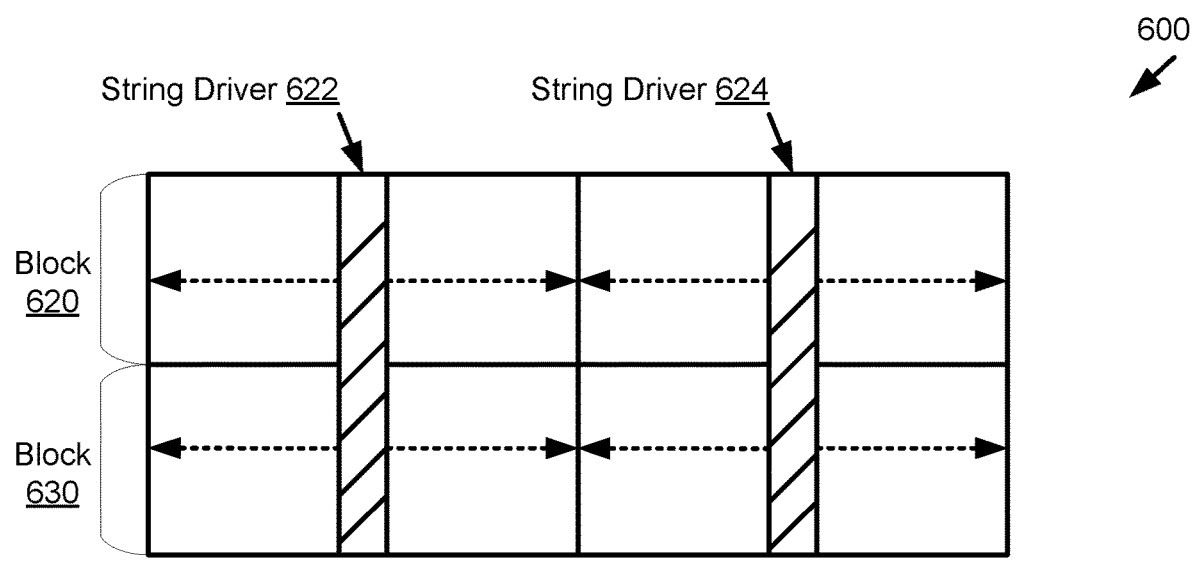
FIG. 6 is a block diagram illustrating shared string drivers between data blocks of a memory device in a memory sub-system, in accordance with some embodiments of the present disclosure.

FIG. 6 is a block diagram illustrating shared string drivers between data blocks of a memory device in a memory sub-system, in accordance with some embodiments of the present disclosure. In implementations, the ability to support sub-block erase in a memory sub-system facilitates the feature of shared string drivers between data blocks, which results in increased size of the data block. Given that sub-block erase enables an erase operation to be performed on one or more sub-blocks of the data block, the increased size of the data block, due to the sharing the string drivers between adjacent blocks, can have minimal effect on the performance of the erase operations of the memory devices.

Data block 620 and data block 630 are two adjacent data blocks that share string driver 622 and string driver 624, in order to reduce latency of read and write operation of data blocks 620, 630. In certain implementations, string driver 622 and string driver 624 can be positioned equally across the wordlines of each data block, such that the latency of each wordline is reduces to one fourth of the latency value in the conventional approach where each data block is driven by a single string driver that is placed at one end of the data block. In an illustrative example, the wordline latency can be measured by a constant called a resistance-capacitance (RC) time constant of the wordline, such that a lower resistance in the wordline can lead to a lower value of the RC time constant, and a faster performing memory device. The wordline RC time constant is highly affected by the length of the wordline because a long wordline can lead to a higher RC than a shorter wordline. Therefore, by utilizing string driver 622 and string driver 624 within data block 620, a wordline of data block 620 can be divided into four portion with string driver 622 driving two portion in two directions and string driver 624 driving the other two portions in the same two directions, as shown by the dotted arrows in FIG. 6. Accordingly, the wordline RC constant is reduced by one fourth of the wordline RC constant when only one string driver is used for driving each data block.

Figure 7:
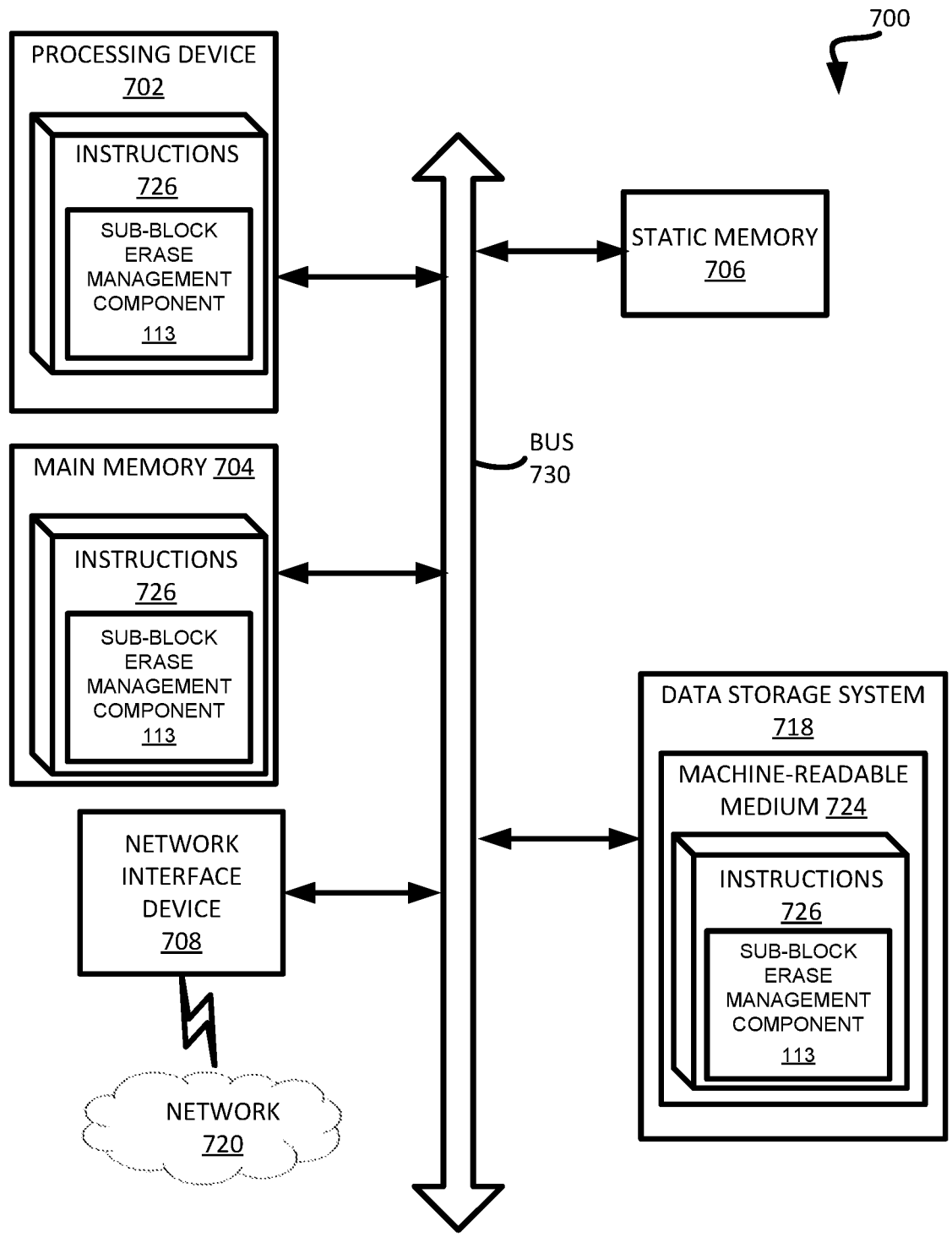
FIG. 7 illustrates an example machine of a computer system within which a set of instructions, for causing the machine to perform any one or more of the methodologies discussed herein, can be executed.

FIG. 7 illustrates an example machine of a computer system 700 within which a set of instructions, for causing the machine to perform any one or more of the methodologies discussed herein, can be executed. In some embodiments, the computer system 700 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the sub-block erase management component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 700 includes a processing device 702, a main memory 704 (e.g., read-only memory (ROM), flash memory, dynamic random access memory (DRAM) such as synchronous DRAM (SDRAM) or Rambus DRAM (RDRAM), etc.), a static memory 706 (e.g., flash memory, static random access memory (SRAM), etc.), and a data storage system 718, which communicate with each other via a bus 730.

Processing device 702 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 702 can also be one or more special-purpose processing devices such as an application specific integrated circuit (ASIC), a field programmable gate array (FPGA), a digital signal processor (DSP), network processor, or the like. The processing device 702 is configured to execute instructions 726 for performing the operations and steps discussed herein. The computer system 700 can further include a network interface device 708 to communicate over the network 720.

The data storage system 718 can include a machine-readable storage medium 724 (also known as a computer-readable medium) on which is stored one or more sets of instructions 726 or software embodying any one or more of the methodologies or functions described herein. The instructions 726 can also reside, completely or at least partially, within the main memory 704 and/or within the processing device 702 during execution thereof by the computer system 700, the main memory 704 and the processing device 702 also constituting machine-readable storage media. The machine-readable storage medium 724, data storage system 718, and/or main memory 704 can correspond to the memory sub-system 110 of FIG. 1.

In one embodiment, the instructions 726 include instructions to implement functionality corresponding to the sub-block erase management component 113 of FIG. 1). While the machine-readable storage medium 724 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:
   receiving an erase request to erase data stored at a data block of a memory device, the erase request identifying a selected sub-block of a plurality of sub-blocks of the data block for erase, each of the plurality of sub-blocks comprising one or more select gate devices (SGDs) and a plurality of data storage devices;
   for each sub-block of the plurality of sub-blocks not selected for erase:
      applying an input voltage at a bitline of the respective sub-block; and
      applying a plurality of gate voltages to a plurality of wordlines of the respective sub-block, the plurality of wordlines comprising one or more wordlines coupled to the one or more SGDs and one or more dummy wordlines coupled to a first subset of the plurality of data storage devices, wherein a voltage of the plurality of gate voltages applied to a successive wordline of the plurality of wordlines is less than a previous voltage applied to a previous wordline.

2. The method of claim 1, wherein the plurality of wordlines further comprises one or more data wordlines coupled to a second subset of the plurality of data storage devices, and wherein the one or more data wordlines are driven using a first string driver that is independent of a second string driver used to drive a second data WL of a second data block of the memory device.

3. The method of claim 2, wherein the voltage of the plurality of gate voltages applied to the successive wordline of the plurality of wordlines is less than the previous voltage applied to the previous wordline by an amount equal to a step down interval.

4. The method of claim 1, wherein the input voltage is reduced to a threshold level at a first data wordline that is used for storing host data.

5. The method of claim 1, wherein each device of the one or more SGDs and the plurality of data storage devices has an associated threshold voltage that is lower than the input voltage.

6. The method of claim 5, wherein the threshold voltage equals approximately 3 volts.

7. The method of claim 1, further comprising:
   connecting a voltage supply to two adjacent SGDs of the one or more SGDs to enable sharing of the voltage supply between the two adjacent SGDs.

8. The method of claim 1, further comprising:
   connecting a voltage supply to two adjacent dummy wordlines of the one or more dummy wordlines to enable sharing of the voltage supply between the two adjacent dummy wordlines.

9. The method of claim 1, wherein a first thickness of a first oxide layer disposed between two adjacent dummy wordlines of the one or more of dummy wordlines is greater than a second thickness of a second oxide layer disposed between two adjacent data wordlines of one or more data wordlines of the data block.

10. A system comprising:
   a memory device; and
   a processing device, operatively coupled with the memory device, to perform operations comprising:
      receiving an erase request to erase data stored at a data block of a memory device, the erase request identifying a selected sub-block of a plurality of sub-blocks of the data block for erase, each of the plurality of sub-blocks comprising one or more select gate devices (SGDs) and a plurality of data storage devices;
      for each sub-block of the plurality of sub-blocks not selected for erase:
         applying an input voltage at a bitline of the respective sub-block; and
         applying a plurality of gate voltages to a plurality of wordlines of the respective sub-block, the plurality of wordlines comprising one or more wordlines coupled to the one or more SGDs and one or more dummy wordlines coupled to a first subset of the plurality of data storage devices, wherein a voltage of the plurality of gate voltages applied to a successive wordline of the plurality of wordlines is less than a previous voltage applied to a previous wordline.

11. The system of claim 10, wherein the plurality of wordlines further comprises one or more data wordlines coupled to a second subset of the plurality of data storage devices, and wherein the one or more data wordlines are driven using a first string driver that is independent of a second string driver used to drive a second data WL of a second data block of the memory device.

12. The system of claim 11, wherein the voltage of the plurality of gate voltages applied to the successive wordline of the plurality of wordlines is less than the previous voltage applied to the previous wordline by an amount equal to a step down interval.

13. The system of claim 10, wherein the input voltage is reduced to a threshold level at a first data wordline that is used for storing host data.

14. The system of claim 10, wherein each device of the one or more SGDs and the plurality of data storage devices has an associated threshold voltage that is lower than the input voltage.

15. The system of claim 14, wherein the threshold voltage equals approximately 3 volts.

16. The system of claim 10, the operations further comprising:
connecting a voltage supply to two adjacent SGDs of the one or more SGDs to enable sharing of the voltage supply between the two adjacent SGDs.

17. The system of claim 10, the operations further comprising:
connecting a voltage supply to two adjacent dummy wordlines of the one or more dummy wordlines to enable sharing of the voltage supply between the two adjacent dummy wordlines.

18. The system of claim 10, wherein a first thickness of a first oxide layer disposed between two adjacent dummy wordlines of the one or more of dummy wordlines is greater than a second thickness of a second oxide layer disposed between two adjacent data wordlines of one or more data wordlines of the data block.

19. A memory device comprising:
a first sub-block of a plurality of sub-blocks of a data block of the memory device, the first sub-block comprising a selected sub-block for an erase operation, wherein each sub-block of the plurality of sub-blocks comprises one or more select gate devices (SGDs) and a plurality of data storage devices; and
a second sub-block of the plurality of sub-blocks of the data block of the memory device, the second sub-block comprising an unselected sub-block for the erase operation, wherein a plurality of wordlines of the second sub-block are configured to receive different gate voltages during the erase operation performed on the selected sub-block, the plurality of wordlines comprising one or more wordlines coupled to one or more SGDs of the second sub-block and one or more dummy wordlines coupled to a first subset of a plurality of data storage devices of the second sub-block, wherein each gate voltage applied to a successive wordline of the plurality of wordlines is less than a previous gate voltage applied to a previous wordline.

20. The memory device of claim 19, wherein each device of the one or more SGDs and the plurality of data storage devices has an associated threshold voltage that is lower than a corresponding gate voltage applied at the respective device, wherein the threshold voltage equals approximately 0 volts.

* * * * *